United States Patent [19]

Imaeda

[11] Patent Number: 4,926,209
[45] Date of Patent: May 15, 1990

[54] IMAGE RECORDING APPARATUS USING PLANAR ILLUMINATOR AS A LIGHT SOURCE

[75] Inventor: Mikio Imaeda, Bisai, Japan

[73] Assignee: Brother Kogyo Kabushiki Kaisha, Aichi, Japan

[21] Appl. No.: 270,649

[22] Filed: Nov. 14, 1988

[30] Foreign Application Priority Data

Nov. 12, 1987 [JP] Japan ................................. 62-287752
Nov. 12, 1987 [JP] Japan ................................. 62-287753

[51] Int. Cl.$^5$ ............................................. G03B 27/32
[52] U.S. Cl. ...................................................... 355/27
[58] Field of Search ......................... 355/20, 27, 28, 29

[56] References Cited

U.S. PATENT DOCUMENTS

| | | | |
|---|---|---|---|
| 3,764,211 | 10/1973 | Morse et al. | 355/20 X |
| 4,141,641 | 2/1979 | Nagal et al. | 355/20 X |
| 4,399,209 | 8/1983 | Sanders et al. | 430/138 |
| 4,786,944 | 11/1988 | Sakamoto et al. | 355/20 |
| 4,829,339 | 5/1989 | Dwyer | 355/20 |

*Primary Examiner*—Donald A. Griffin
*Attorney, Agent, or Firm*—Oliff & Berridge

[57] ABSTRACT

In an image recording apparatus, a planar illuminator is disposed in confronting relation to a surface of a photosensitive recording medium. The planar illuminator includes a plate-like insulating substrate having on a surface thereof a multiplicity of dimples arranged in rows and columns. Each dimple is receptive of a metal particle which emits white light when energized.

11 Claims, 3 Drawing Sheets

IMAGE RECORDING APPARATUS USING PLANAR ILLUMINATOR AS A LIGHT SOURCE

BACKGROUND OF THE INVENTION

The present invention relates to an image recording apparatus, and more particularly to an image recording apparatus in which a photosensitive recording medium is exposed to light by a planar illuminator serving as a light source.

Heretofore, there is known an image recording apparatus for recording an image according to electrophotograhpic process. A recording medium used in such an apparatus is uniformly pre-charged to one of the polarities. There is also known an image recording apparatus using a photosensitive pressure-sensitive recording medium proposed in U.S. Pat. No. 4,399,209 to Sanders et al. On one surface of the recording medium, microcapsules encapsulating chromogenic material and photocuring resin are uniformly coated, and when the recording medium is exposed to light, the microcapsules are selectively photocured, whereas the rest of the microcapsules remain uncured. The recording medium thus exposed to light is brought in facial contact with a developer sheet and both are pressed against each other. Upon applying pressure to the recording medium, the uncured microcapsules are ruptured and the chromogenic material flown out of the microcapsules react with a developer material coated on the developer sheet, so that a visible image is formed on the developer sheet.

In the two recording apparatuses described above, a CRT (cathode ray tube) can be used as a light source. The CRT is disposed so that its ilumination surface confronts the photosensitive recording medium, between which an optical system such as a spherical lens or an optical fiber bundle is disposed to apply light from the CRT illumination surface onto the surface of the photosensitive recording medium.

In the exposure by the CRT, a variety of photo-sensitive recording media can be exposed to light emitted from a fluorescent substance if the latter is selected so that the wavelength of the light falls within a specified range of sensitivity Of the individual photo-sensitive recording medium. Further, selection of the fluorescent substance enables to compensate for the sensitivity characteristics of the individual photosensitive recording medium.

However, in the case where a CRT is used as a light source, partly because a CRT is usually as deep as its screen and hence is heavy in weight, and partly because an electron gun and a grid are required to be impressed with a high voltage of several kilovolts, the entire apparatus would inevitably be large in size and heavy in weight. Further, with CRTs now on the market, it is difficult to expect an improved resolution power of a picture image.

SUMMARY OF THE INVENTION

It is therefore an object of the present invention to provide an image recording apparatus which is small in size and light in weight and forms an image in an excellent quality.

Another object of the invention is to provide an image recording apparatus in which when a photosensitive pressure-sensitive recording medium is used, a high-quality output image can be formed thereon.

According to the present invention, there is provided an image recording apparatus for forming an image on a surface of a photosensitive recording medium according to an image information of an original, said apparatus comprising:

(a) a planar illuminator disposed in confronting relation to said surface of said photo-sensitive recording medium, said planar illuminator being a plate-like insulating substrate and including a multiplicity of illuminant elements arranged in a matrix form, each of said illuminant elements having positive and negative electrode terminals and being selectively energized according to the image information of the original to emit light toward said surface of said photosensitive recording medium to expose corresponding areas of said surface to thereby form on said surface of said photosensitive recording medium a latent image corresponding to an image of the original; and (b) a developing device for developing said latent image to provide a visible image. Many other advantages, features and additional objects of the present invention will become manifest to those versed in the art upon making reference to the detailed description and the accompanying drawings in which several embodiments incorporating the principles of the present invention are shown by way of illustrative example.

BRIEF DESCRIPTION OF THE DRAWINGS

In the drawings.

Throughout several views in the drawings, like reference numerals designate similar parts or elements having similar functions.

DETAILED DESCRIPTION OF THE PREFERRED EMBODIMENTS

Figure 1:
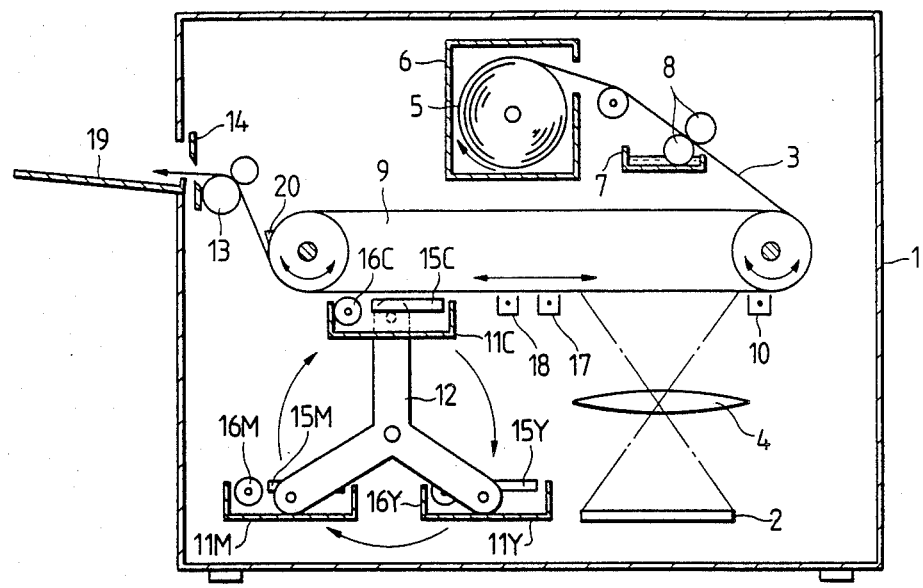
FIG. 1 is a schematic vertical cross-sectional view showing an electrophotographic image recording apparatus according to a first embodiment of the present invention.

The principles of the present invention are particularly useful when embodied in an electrophotographic image recording apparatus such as shown in FIG. 1, generally designated by numeral 1.

A photosensitive recording paper 3 to be used in a first embodiment shown in FIG. 1 is such that on an electrically conductive substrate, a mixture of titanium dioxide ($TiO_2$) and a binder kneaded to be pastry is coated uniformly.

In the apparatus 1 in FIG. 1, a roll of photosensitive paper 6 is contained in a paper cassette 6. The paper cassette 6 has an opening at one side wall thereof, from which the photosensitive paper 6 is payed out. Adjacent to the paper cassette 6 and slightly below its opening, a tub 7 is disposed in which a moistening liquid is filled. A pair of moistening rollers 8 are provided in the tub 7 so that a counterpart of the rollers 8 is partly immersed into the moistening liquid 7. The photosensitive paper 3 payed out from the paper cassette 6 is passed through a nip between the rollers 8, whereby the photosensitive paper 3 is coated at a back surface thereof with the moistening liquid. An electrically conductive endless conveyor belt 9 made of, for example, stainless steel or nickel (Ni) is disposed below the tub 9, with which the photosensitive paper 3 is conveyed as the latter is in contact with the conveyor belt 9. A corona discharger 10 is provided in the rightmost position of the conveyor belt 9 in closed relation to the lower side belt 9. The corona discharger 10 is impressed with a negative high voltage and negative electric charges are thereby applied to the front surface of the photosensitive paper 3. A planar illuminator 2 (described below) is disposed below the conveyor belt 9 in parallel relation thereto. Light emitted from the planar illuminator 2 is applied onto the lower side conveyor belt through a spherical lens 4, and the region on the lower side conveyor belt onto which the light is applied is defined as an exposing station. The photosensitive paper 3 attached to the conveyor belt 3 is stopped in the exposing station, whereupon an image-bearing light from the planar illuminator 2 is irradiated onto the photosensitive paper 3 to thereby form an image thereon.

Figure 2:
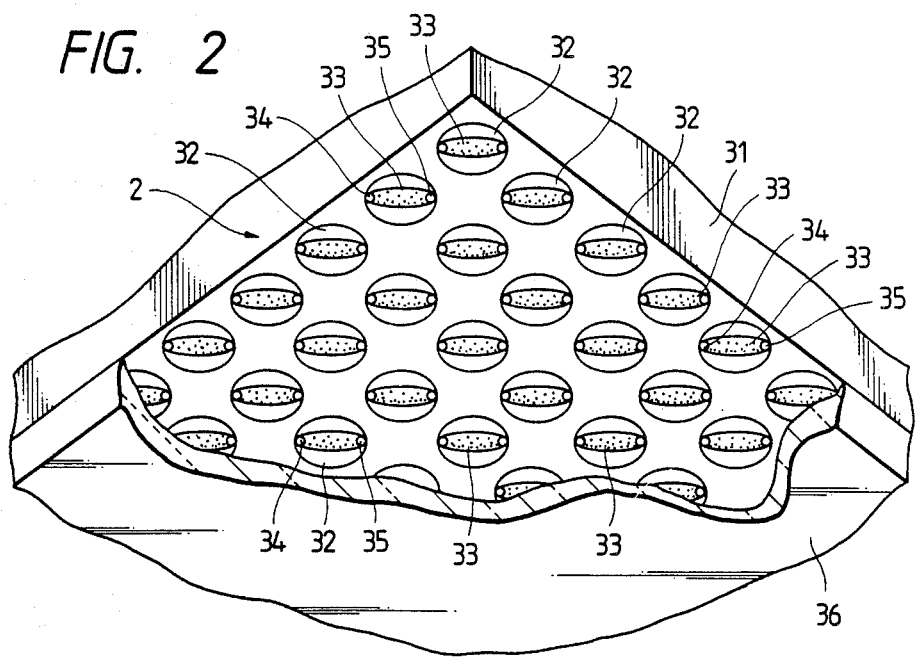
FIG. 2 schematic perspective view, with parts broken away, of a planar illuminator.

As shown in FIG. 2, the planar illuminator 2 comprises a plate-like insulating substrate 31 having on one surface thereof a multiplicity of dimples 32 arranged in matrix form, i.e. the dimples 32 are orderly arranged in row and columns. A multiplicity of metal particles 33 made of, for example, tungsten are sticked to inner surface of each of the dimples 32 so as to form a metal (tungsten) layer. Each metal layer 33 is provided with positive and negative electrode terminals 34 and 35. As the metal layers 33 are selectively energized and heated in accordance with the image information of an original, the individual metal layers 33 emit white light. Thus, these metal layers 33 serve as illuminant elements. The surface of the substrate 34 is covered with a sheet of glass 36.

In the planar illuminator 2, like a liquid crystal or an EL (electroluminescence) element, as the metal layers 33 are impressed with an image signal voltage progressively one scanning line after another, the individual metal layers 33 emit white light according to the impressed voltage to thereby indicate an image. Titanium dioxide ($TiO_2$) is a photo-conductive material which is particularly sensitive to light having a wavelength around 400 nm to 420 nm, and the white light emitted from the individual metal layers 33 include light having a wavelength within that range. When the electric charge at the exposed areas on the photosensitive paper 3 is grounded, an electrostatic latent image is formed on the photosensitive paper 3.

Even if, with the use of a known photo-sensitizer, the photosensitive paper 3 is made to be sensitive to light in a longer wavelength, the planar illuminator 2 is still available as it emits light in the range covering an ultrared region. In the case where the white light emitted from the planar illuminator 2 includes unwanted light components which may adversely affect image formation, the sheet of glass 36 may preferably be colored to provide a filter to pick up only wanted light components.

A color picture image is formed on the photosensitive paper 3 in the process discussed above; during which time three electrostatic latent images corresponding to Yellow, magenta and cyan are formed, whereupon the latent images are developed.

Referring back to FIG. 1, a developer unit is provided leftwardly of the planar illuminator 2. The developer unit includes a tri-armed member 12 rotatable about its axis. The tri-armed member has three arms integrally formed, in which each arm extends radially and is separated at equiangle (120 degrees). To the ends of the three arms, yellow, magenta and cyan toner developing devices 11Y, 11M and 11C are rotatably secured. In the cyan developing device 11Y, a yellow developing liquid is contained and a doctor roller 16Y is provided for preventing a toner fogging. A developing electrode 15Y is further provided in the cyan developing device 11Y, to which applied is a developing voltage for developing a color image corresponding to yellow. Likewise, magenta and cyan developing liquids are contained in the developing devices 11M and 11C, and doctor rollers 16M and 16C and developing electrodes 15M and 15C are provided therein, respectively.

For development of yellow, the tri-armed member 12 is rotated, and the yellow toner developing liquid is applied to the unexposed areas of the photosensitive paper 3 to provide an image pattern. The doctor roller 16Y is electrically conductive and is impressed with a negative voltage higher than the residual potential at the exposed areas on the photosensitive paper 3. The doctor roller 16Y has a polarity different from that of the toner and thus prevents the non-image areas (exposed areas) from the toner fogging.

After the development for yellow has terminated, the conveyor belt 9 is moved reversely, and the photosensitive paper 3 is again placed in the exposing station. During this movement, the photosensitive paper 3 is first neutralized in surface potential as received corona discharge of an AC or positive high voltage by a deelectrifying corotoron 18. The paper 3 is again charged uniformly with negative polarity by a corona charger 17. In like manner, the processes of exposure, development, neutralization of electric charges, and uniform charging are performed with respect to magenta, and then the same processes are repeatedly performed with respect to cyan. As a result, a full-color image is obtained.

The photosensitive paper 3 on which the image has been formed is separated from the conveyor belt g by a separator pawl 20 and is then discharged onto a discharge tray 19 via an excessive developing liquid collecting roller 13 as the conveyor belt 9 is moved in the forward direction.

After the photosensitive paper 3 has been discharged out of the apparatus 1 by a predetermined length, such discharged portion is severed from the photosensitive paper 3 by a cutter 14, whereby all the processes for color image recording have been completed.

Figure 3:
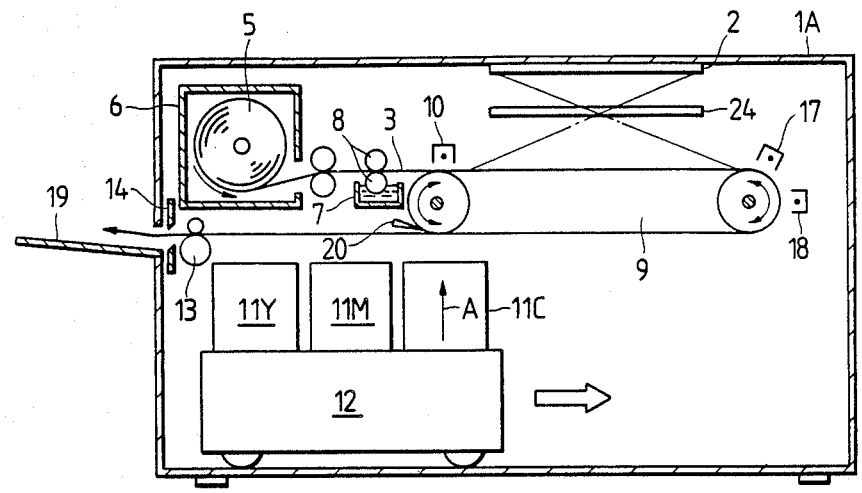
FIG. 3 schematic vertical cross-sectional view showing an electrophotographic image recording apparatus according to embodiment of the present invention.

FIG. 3 illustrates an image recording apparatus 1A according to a second embodiment of the invention, in which an image bearing light from the planar illuminator 2 is irradiated onto the photosensitive paper 3 in the same manner as in the first embodiment, but a so-called microlens 24 is used instead of the spherical lens 4. The microlens 24 is in the form of a plate composed of a plurality of minute lenses; this microlens 24 forms on the photosensitive paper 3 an image which is equimultiple and real image of the image on the planar illuminator 2. The use of the microlens 24 allows to shorten the focal length as compared with the spherical lens. Due to the use of the microlens 24 and the planar illuminator 2, an exposure system can be made in compact size.

At the lower portion of the apparatus 1A, there is provided a developing device 12 which is horizontally movable as indicated by an arrow. When the photosensitive paper 3 with an electrostatic latent image formed thereon arrives at position under the conveyor belt 9, the developing device 12 is moved to a suitable position and one of three developing devices 11Y, 11M, 11C is selectively elevated in the direction of an arrow A for the development of one of yellow, magenta and cyan.

Other parts of the second embodiment are similar to the corresponding parts of the first embodiment. Accordingly their detailed description is omitted herein.

In the planar illuminator 2 of the present invention, since the light emitted therefrom shows a continuous spectrum ranging substantially from ultraviolet to ultrared, this planar illuminator 2 can be used for a variety of image recording apparatus employing various kinds of photosensitive materials. By increasing the number of metal particles 33 formed in unit area on this planar illuminator 2, the resolution power of the image can be improved to, for example, 8 dots/mm or 16 dots/mm. Instead of the metal particles 33, ceramic particles may be used.

Figure 4:
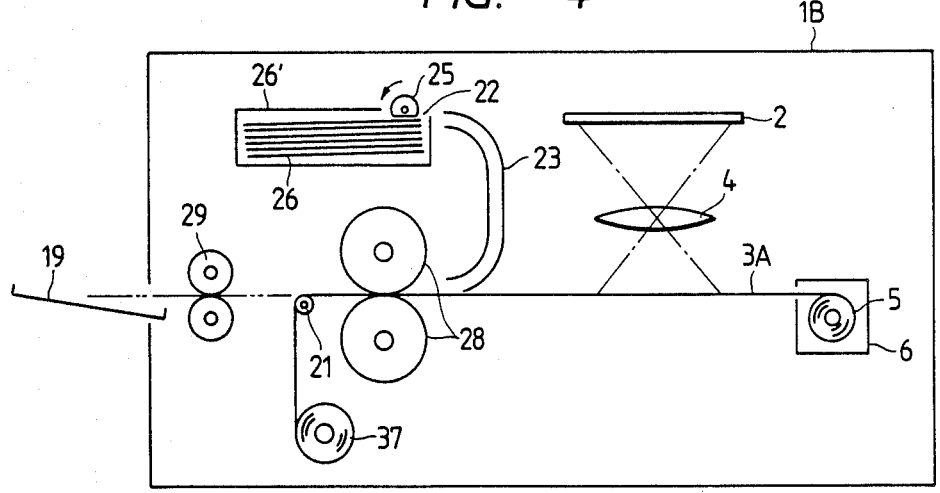
FIG. 4 a schematic vertical cross-sectional view showing an image recording apparatus according to a third embodiment of the present invention.

FIG. 4 illustrates an image recording apparatus 1B according to a third embodiment of the invention, in which a photosensitive pressure-sensitive recording paper 3A and a developer sheet 26 (described below) are used instead of the photosensitive paper 3 used in the first and second embodiments.

As disclosed in U.S. Pat. No. 4,399,209, the photosensitive pressure-sensitive recording paper 3A comprises a substrate coated at an surface thereof with encapsulated chromogenic material or color former which are curable when exposed to light. The developer sheet 26 comprises a substrate coated at one surface thereof with a developer material. When the unexposed and hence uncured microcapsules on the photosensitive pressure-sensitive recording paper 3A are ruptured as the photosensitive pressure-sensitive paper 3A and the developer sheet 26 are pressed against each other by a pressure developing device 28, the developer material on the developer sheet 26 reacts with the chromogenic material flown out of the microcapsules on the photosensitive pressure-sensitive recording paper 3A to thereby forming an image on the developer sheet 26.

In the apparatus 1B shown in FIG. 4, the photo-sensitive pressure-sensitive recording paper 3A is payed out from a roll 5 contained in a paper cassette 6 and passes through an exposing station and the pressure developing device 28 and is finally wound round a take-up reel 37.

In the exposing station, a planar illuminator 2 (see the foregoing description in connection with FIG. 2) is disposed in confronting relation to the front surface of the photosensitive pressure-sensitive recording paper 3A; an image-bearing light from the planar illuminator 2 is irradiated onto the photosensitive pressure-sensitive recording paper 3A through a spherical lens 4. Thus, a latent image corresponding to the image on the planar illuminator 2 is formed on the front surface of the photosensitive pressure-sensitive paper 3A.

After this exposure, the photosensitive pressure-sensitive recording paper 3A is fed to the pressure fixing device 28. A developer sheet 26 is fed out from a sheet cassette 26' by a delivery roller 25 disposed at an outlet port 22 and is delivered to the pressure fixing device 28 via a guide 23 in timed relation to the feeding of the photosensitive pressure-sensitive recording paper 3A.

The exposed photosensitive pressure-sensitive recording paper 3 is brought into facial contact with the developer sheet 26 and is subjected to pressure development by the pressure developing device 28. In the pressure development, the uncured microcapsules on the photo-sensitive pressure-sensitive recording paper 3A are ruptured so that the developer material on the developer sheet 26 reacts with the chromogenic material flown out of the microcapsules on the photosensitive pressure-sensitive paper 3A. As a result, a visible image corresponding to the latent image on the photosensitive pressure-sensitive recording paper 3A is formed on the developer sheet 26.

After this development, the developer sheet 26 with the visible image formed thereon is separated from the photosensitive pressure-sensitive recording paper 3A by a separator roller 21 and is then discharged onto the discharge tray 19 via a heat-fixing device 29 where the image on the developer sheet 26 is fixed and is made glassy by the application of heat. The photosensitive pressure-sensitive recording paper 3A is wound round the take-up reel In the apparatus 1B, if the photosensitive pressure-sensitive recording paper 3A, the developer sheet 26 and the planar illuminator 2 are those for color mode, a color image is formed on the developer sheet 26. If those are for monochromatic mode, a monochromatic image is formed thereon.

Figure 5:
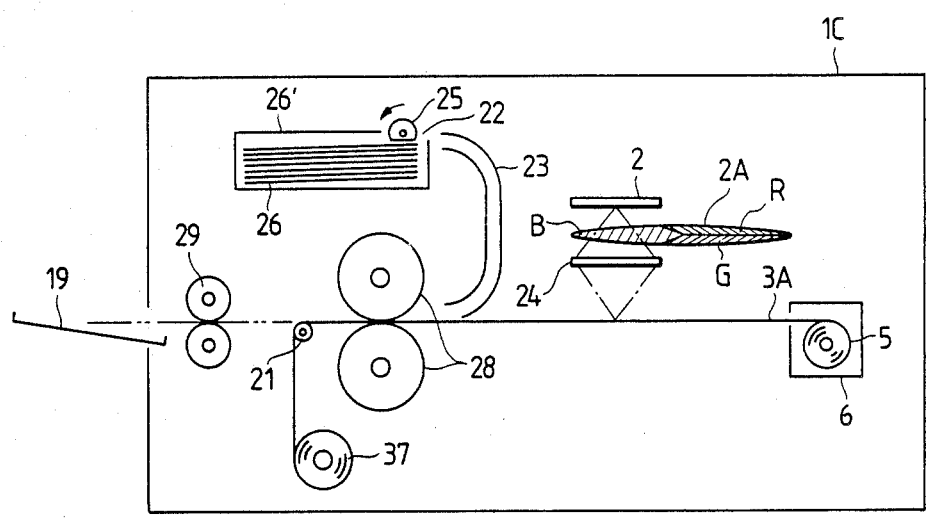
FIG. 5 a schematic vertical cross-sectional view showing an image recording apparatus according to a fourth embodiment of the present invention.

FIG. 5 illustrates an image recording apparatus 1C according to a fourth embodiment of the invention which is similar to the third embodiment of FIG. 4 except the exposure system. The planar illuminator 2 in this exposure system is free of any cover as a filter covering over the front surface of the planar illuminator 2 and hence is adapted to indicate a monochromatic image by only darkness and brightness of white light. Disposed immediately under the front surface of the planar illuminator 2 is a filter 2A for filtering the light from the planar illuminator 2 to pickup one of three primary colors, i.e. red, green and blue. A microlens 24 is disposed between the filter 2A and the photosensitive pressure-sensitive paper 3A.

In operation, the filter 2A is first set in a "red" position, and the photosensitive pressure-sensitive recording paper 3A is exposed to light from the planar illuminator 2 through the filter 2A to receive only a redcolor image. Then, the filter 2A is set in a "green" position, and the photo-sensitive pressure-sensitive paper 3A is exposed to light from the planar illuminator 2 through the filter 23 to receive only a green-color image. Finally, the filter 2A is set in a "blue" position, and the photosensitive pressure-sensitive paper 3A is exposed to light from the planar illuminator 2 through the filter 2A. As a result, corresponding to the exposure for each color, a latent image is formed on the front surface of the photosensitive pressure-sensitive paper 3A in a pattern of cured (exposed) and uncured unexposed microcapsules. In other words, all three latent images are formed on the photosensitive pressure-sensitive paper 3A. The resulting photosensitive pressure-sensitive paper 3A is fed to the pressure developing device 28 where the paper 3A and the developer sheet 26 are pressed against each other. As the uncured microcapsules on the photosensitive pressure-sensitive paper 3A are ruptured under the pressure, the developer material on the developer sheet 26 reacts with the chromogenic material on the photosensitive pressure-sensitive paper 3A to form a color image. A visible full-color image corresponding to the latent images on the photosensitive pressure-sensitive paper 3A is formed on the developer sheet 26.

Alternatively, the microlens 24 and the filter 2A may be replaced with each other. In another alternative form, like the third embodiment of FIG. 4, a spherical lens may be used instead of the microlens 24. In the third embodiment of FIG. 4, microlens 24 may be used instead of the spherical lens 4.

Many other modifications and variations of the present invention are possible in the light of the foregoing teachings. It is therefore to be understood that within the scope of the appended claims, the invention may be practiced otherwise than as specifically described.

What is claimed is:

1. An image recording apparatus for forming an image on a surface of a photosensitive recording medium according to an image information of an original, said apparatus comprising:
   (a) a planar illuminator disposed in confronting relation to said surface of said photo-sensitive recording medium, said planar illuminator being a plate-like insulating substrate and including a multiplicity of illuminant elements arranged in a matrix for, each of said illuminant elements having positive and negative electrode terminals and being selectively energized according to the image information of the original to emit light toward said surface of said photosensitive recording medium to expose corresponding areas of said surface to thereby form on said surface of said photosensitive recording medium a latent image corresponding to an image of the original; and
   (b) a developing device for developing said latent image to provide a visible image.

2. An image recording apparatus according to claim 1, wherein said plate-like insulating substrate has on one surface thereof a multiplicity of dimples arranged in rows and columns, each of said dimples being receptive of a respective one of said illuminant elements.

3. An image recording apparatus according to claim 2, wherein each of said illuminant elements comprises a multiplicity of metal particles and is provided with a positive electrode and a negative electrode, each of said illuminant elements emitting white light.

4. An image recording apparatus according to claim 3, wherein said metal particle comprises tungsten.

5. An image recording apparatus according to claim 2, wherein said planar illuminator has a sheet of glass covering said surface of said planar illuminator.

6. An image recording apparatus according to claim 1, wherein said photosensitive recording medium comprises an electrically conductive substrate having a surface, and a mixture of titanium dioxide and a binder, which mixture being uniformly coated on said surface of said substrate.

7. An image recording apparatus according to claim 1, wherein said photosensitive recording medium comprises a photosensitive pressure-sensitive recording medium, and a developer sheet, said photosensitive pressure-sensitive recording medium including a substrate coated at one surface thereof with microcapsules encapsulating at least a chromogenic material, a mechanical strength of which being varied when exposed to light, and said developer sheet including a substrate coated at one surface thereof with a developer material reactive with said chromogenic material.

8. An image recording apparatus according to claim 1, further including lens means disposed between said planar illuminator and said recording medium for imaging the light from said illuminant elements on said recording medium.

9. An image recording apparatus according to claim 8, wherein said lens means is a spherical lens.

10. An image recording apparatus according to claim 8, wherein said lens means is a microlens in the form of a plate composed of a plurality of minute lenses.

11. An image recording apparatus according to claim 1, further including a filter disposed between said planar illuminator and said recording medium for filtering the light from said planar illuminator to pickup a light of a predetermined wavelength.

* * * * *